United States Patent [19]

Tokumaru et al.

[11] 4,110,634

[45] Aug. 29, 1978

[54] GATE CIRCUIT

[75] Inventors: Yukuya Tokumaru; Masanori Nakai, both of Yokohama, Japan

[73] Assignee: Tokyo Shibaura Electric Co., Ltd., Tokyo, Japan

[21] Appl. No.: 712,668

[22] Filed: Aug. 9, 1976

[30] Foreign Application Priority Data

Aug. 9, 1976 [JP] Japan .................................. 51-96786
Aug. 9, 1975 [JP] Japan .................................. 50-96787

[51] Int. Cl.² ...................... H03K 19/08; H03K 19/20
[52] U.S. Cl. .................................... 307/213; 307/303; 307/313; 307/317 A; 357/15; 357/36; 357/92
[58] Field of Search .................... 307/313, 317 A, 303, 307/213; 357/15, 44, 46

[56] References Cited

U.S. PATENT DOCUMENTS

| 3,922,565 | 11/1975 | Berger et al. | 357/46 X |
|---|---|---|---|
| 3,961,351 | 6/1976 | Blatt | 357/46 X |
| 3,986,045 | 10/1976 | Lutz | 307/317 A |
| 3,987,310 | 10/1976 | Peltier et al. | 307/317 A |

Primary Examiner—John Zazworsky
Attorney, Agent, or Firm—Henderson, Farabow & Garrett Finnegan

[57] ABSTRACT

A gate circuit is constituted by a plurality of logical elements formed on the same P type semiconductor substrate. Each logical element is composed of an N type first region and P type second region formed by double diffusion in one of a plurality of P type isolated islands formed on a P type semiconductor substrate, and an N type isolating region and N type buried region surrounding the islands. The P type second region, N type first region and P type island constitute a first vertical PNP transistor by operating as an emitter, base and collector, respectively, while the N type first region, P type island and N type buried region constitute a second vertical NPN transistor by operating as an emitter, base and collector, respectively. In the plurality of logical elements, a Schottky diode is provided for each input section thereof. Connected to a connection point between an anode of this Schottky diode and a base of the second vertical NPN transistor of one logical element is a collector of that of another logical element. A collector of the second NPN transistor of one logical element constitutes an output section.

10 Claims, 20 Drawing Figures $B = \overline{A1 + A2}$

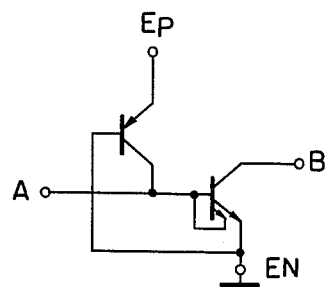
F I G. 11
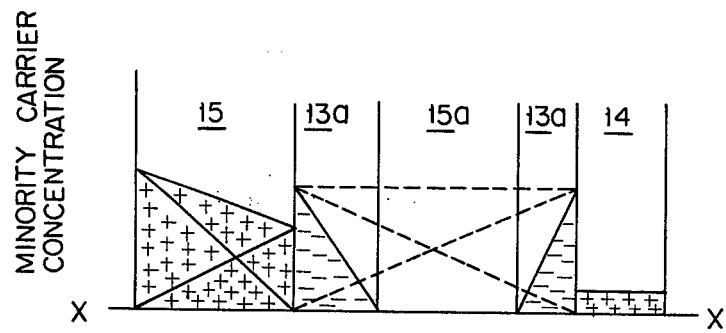
F I G. 12A
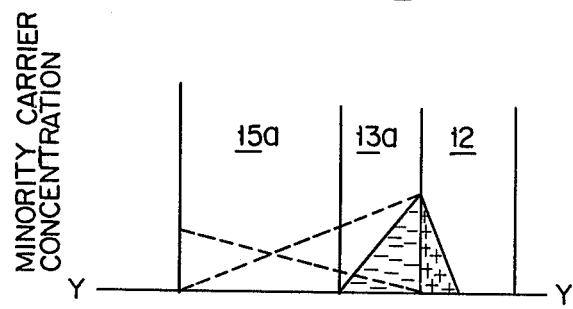
F I G. 12B

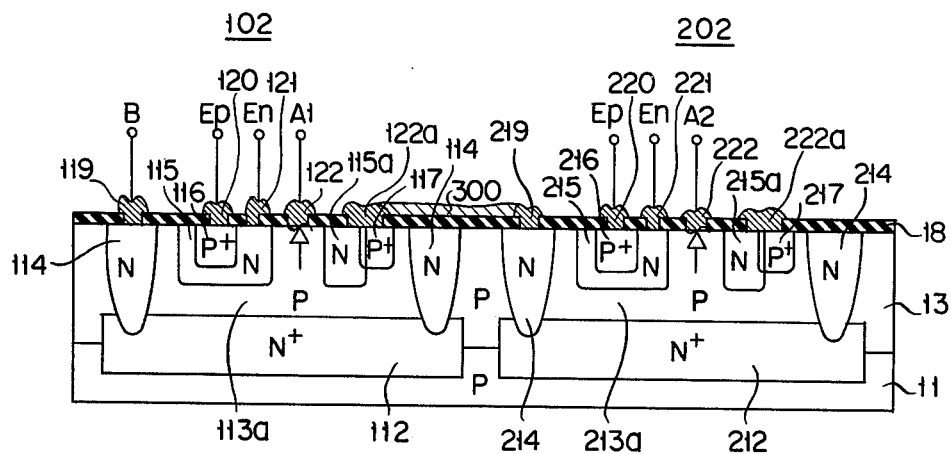
F I G. 13
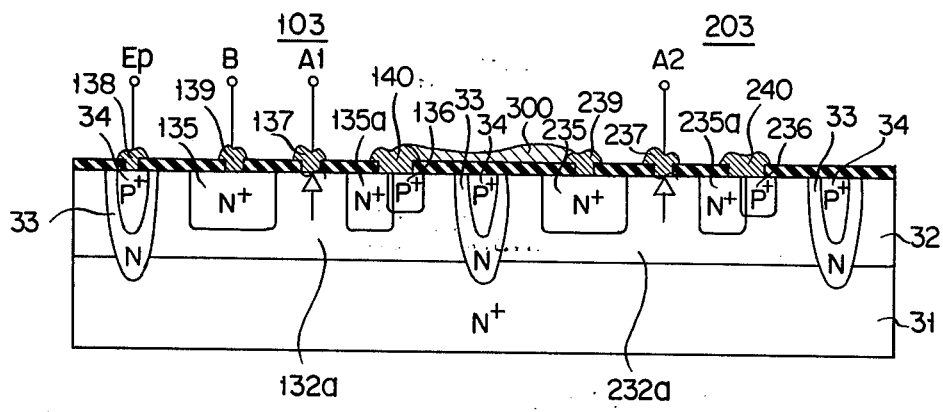
F I G. 15
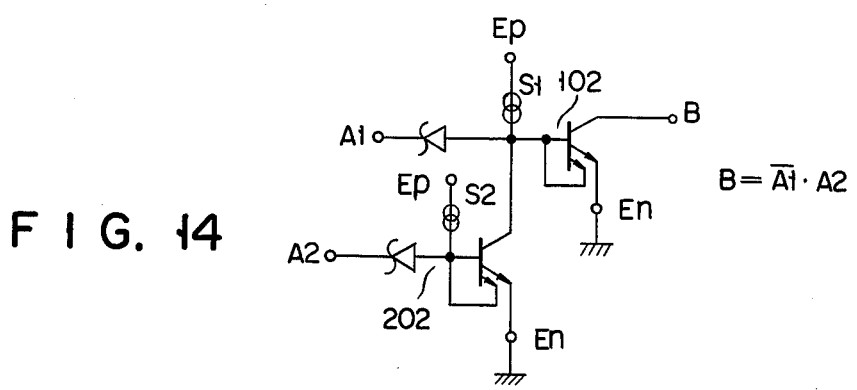
F I G. 14
$B = \overline{A1} \cdot A2$

GATE CIRCUIT

This invention relates to a gate circuit constituted by combination of a plurality of logical circuits formed on the same semiconductor substrate.

Recently, attention has been drawn to a logical circuit element, i.e., Integrated Injection Logic (I²L) which is simpler in construction, higher in manufacturing yield, integrated to a greater degree degree, and smaller in power dissipation than a conventional logical circuit such as DTL (Direct Transistor Logic), TTL (Transistor Transistor Logic) or CML (Current Mode Logic), and a gate circuit is attempted to be formed by the use of such I²L elements.

Conventionally, in such an I²L element, on an N type semiconductor substrate, an N type epitaxial layer is laminated having a lower impurity concentration than the substrate, the epitaxial layer having therein P type first and second regions whose impurity concentration is in the range of about $10^{17}$ to $10^{19}$ atoms/cm³. In the P type first region is formed an N type third region having an impurity concentration of $10^{18}$ to $10^{21}$ atoms/cm³. Note that the impurity concentration of the epitaxial layer is set to a smaller value than the impurity concentration of the P type regions.

The above-mentioned conventional I²L element is constituted by a lateral PNP transistor whose emitter, base and collector are constituted by the P type second region, epitaxial layer and P type first region, respectively, and a vertical NPN transistor whose emitter, base and collector are constituted by the epitaxial layer, P type first region and N type third region, respectively.

When, in the conventional I²L element, a forward voltage is applied to a PN junction between the P type second region and the N type epitaxial layer, positive holes are injected into the P type first region from the P type second region through the epitaxial layer. When, at this time, an input signal having a logical level of "1" is supplied to that base region (P type first region) of the vertical transistor which constitutes an input region of the I²L element, the emitter current $I_{Ep}$ supplied from the emitter region (P type second region) of the base-grounded lateral transistor is multipled by α PNP representing the current amplification factor of the lateral transistor (that is to say, $I_{Ep} \times \alpha_{PNP}$) to flow in the P type first region constituting the collector region of the lateral transistor and concurrently acting as the base region of the vertical transistor. As a result, the vertical transistor is rendered conductive, whereby an output region of the I²L element, namely the collector region of the vertical transistor (N type third region) has a logical level of "0." Note that production of collector current in this collector region is permitted up to a maximum value obtained by multiplying the base current of the vertical NPN transistor by $\beta_{NPN}$ representing the current amplification factor of this NPN transistor.

Where an input signal having a logical level of "0" is supplied to the base region of the vertical transistor, the emitter current thereof is caused to flow out through an input terminal and fails to become a base current of the vertical NPN transistor. Therefore, this vertical transistor is rendered non-conductive, whereby the output region, i.e., the collector region of the vertical transistor has a logical level of "1."

Namely, as apparent from the foregoing operational explanation, this I²L element constitutes an inverter which output becomes "0" with respect to its input "1" and becomes "1" with respect to its input "0."

By the way, the power dissipation of the above-mentioned I²L element is greatly influenced by the characteristics of the lateral PNP transistor, i.e., the current amplification factor $\alpha_{PNP}$ of the base-grounded transistor, and the more approximate to 1 the $\alpha_{PNP}$ is, the smaller the power dissipation is. Further, the maximum operational speed, frequency characteristics, fan-out, noise margin, etc. of the vertical transistor operating as an inverter element are affected by the characteristics of the vertical NPN transistor, especially by the grounded emitter current amplification factor $\beta_{NPN}$ and the gain-bandwidth product $f_T$ thereof. Accordingly, in this I²L element, it is important to increase the respective current amplification factors of the lateral PNP and vertical NPN transistors, and the gain-bandwidth product $f_T$ of the vertical NPN transistor at the same time.

In the conventional I²L element, it is relatively easily possible to set to a suitable value the ratio of impurity concentration between the emitter and base regions of the lateral PNP transistor and to decrease the density of the recombination center within the base region. However, where the base region is so formed as to have a narrow base width with an aim at improving the carrier transfer efficiency, the narrowing of this base width is restricted by a photoetching technique, especially by mask precision and therefore that base width is at present limited to a range of 5 to 10 μm. Furthermore, since the emitter and collector regions are formed, by diffusion, in the N type epitaxial layer in such a manner as to separate laterally, the interval between the opposed diffusion side faces of both regions is broadened in the depth direction, namely takes the form of a reversed flare. That is to say, the base width of the base region formed between the emitter and collector regions is increased, whereby the carrier transfer efficiency is largely decreased. Further, due to the reversed flare-like diffusion, the inclination of impurity concentration at the junction surface between the emitter and base regions is very gentle and as a result the injection efficiency of carriers into the base region is decreased. For this reason, extreme difficulties have been encountered in manufacturing the I²L element by utilizing the conventional structure thereof, so that the lateral PNP transistor may have a large current amplification factor.

In the case of the vertical NPN transistor, the N type epitaxial layer constitutes an emitter region, and the regions formed, by double diffusion, in that emitter region are used as base and collector regions, respectively. Though, accordingly, it is relatively easy to narrow the base width, the emitter region is required to have a lower impurity concentration than the base region. Furthermore, since a retarding field is applied to the carriers injected into the base region due to the inclination of impurity concentration thereof, the injection efficiency is decreased to cause an extreme decrease in the current amplification factor of the vertical NPN transistor operating the N type epitaxial layer as an emitter.

Further, in the conventional I²L element, since respective parts of the regions constituting the lateral PNP transistor and vertical NPN transistor, respectively, are commonly used, even if the ratio in terms of impurity concentration between those regions are so determined as to permit a rise in the current amplification factor of one transistor, it will be followed by a fall in the current amplification factor of the other transistor. For example, where the impurity concentration of the base region, i.e., N type epitaxial layer is set low for the purpose of improving the carrier injection efficiency of the lateral PNP transistor, the carrier injection efficiency of the vertical NPN transistor will be remarkably decreased because that N type epitaxial layer is commonly used also as the emitter region of the vertical NPN transistor. Also, the gain-bandwidth product of this vertical NPN transistor will have a small value because, as above stated, this transistor has a low current amplification factor and yet its emitter region is constituted by the whole of the N type epitaxial layer.

The above-mentioned drawbacks impose a specific limitation upon the reduction in power dissipation, and the increase in operational speed, of the I²L element, and especially makes almost impossible the operation of the I²L element in a high frequency zone of the used signal.

Further, where an attempt is made to provide a Schottky diode for an input region of the conventional I²L element, since the P type first region as this input region has a high impurity concentration, the formation of such Schottky diode in that first region is impossible, resulting in the rise of a necessity to provide separately a region for forming therein the Schottky diode. This causes a decrease in the integrated degree of the I²L element. Further, where an attempt is made to construct a logical circuit device capable of satisfying a desired logical formula, by combining a plurality of I²L elements having no input Schottky diode incorporated therein, a large number of I²L elements become necessary.

Accordingly, it is an object of the invention to provide a gate circuit constructed by combining a plurality of logical elements each having a current source, a transistor connected to the current source and acting as an inverter element, and a Schottky diode provided on the input side of the logical element.

It is another object of the invention to provide a gate circuit wherein a carrier drafting region is provided in the base region of the inverter element to further improve the inverting speed.

It is still another object of the invention to provide a gate circuit wherein a clamping diode is provided between the base and collector of the inverter element to further improve the inverting speed.

According to the invention, there is provided a gate circuit comprising a plurality of logical elements provided for the same semiconductor substrate, each of said plurality of logical elements including; at least one Schottky diode having its cathode connected to an input terminal of the logical element; a transistor having a base connected to an anode of said Schottky diode, at least one collector and at least one emitter and operating as an inverter; and a current source circuit element connected to a connection point between said base of said transistor and said anode of said Schottky diode, the collector of said transistor of one of said logical elements operating as an output section; the collector of said transistor of another one of said logical elements being connected to said connection point; and the respective emitters of said transistors included in said logical elements being connected to the same potential point.

Further according to the invention there is provided a gate circuit comprising a plurality of logical elements provided for the same semiconductor substrate, each of said plurality of logical elements including; at least one Schottky diode having its cathode connected to an input terminal of the logical element; a transistor having a base connected to an anode of said Schottky diode, at least one collector and at least one emitter and operating as an inverter; and a current source circuit element connected to a connection point between said base of said one transistor and said anode of said Schottky diode and the other transistor opposite in polarity to said one transistor, the collector of the other transistor and the base of said one transistor being constituted by a common region and the base of said the other transistor and the emitter of said one transistor being constituted by another common region, the collector of said one transistor of one of said logical elements operating as an output section; the collector of said one transistor of another one of said logical elements being connected to said connection point, and the respective emitters of said one transistors included in said logical elements being connected to the same potential point.

This invention can be more fully understood from the following detailed description when taken in conjunction with the accompanying drawings.

FIG. 11 is a circuit diagram of an equivalent circuit to the logical element shown in FIG. 10;

FIGS. 12A and 12B show a carrier distribution pattern taken along the line X—X, and that taken along the line Y—Y, of the logical element shown in FIG. 10;

FIG. 13 is a sectional view of a semiconductor device constituting the gate circuit according to another embodiment of the invention;

FIG. 14 is a circuit diagram showing the gate circuit constituted by the semiconductor device of FIG. 13;

FIG. 15 is a sectional view of a semiconductor device constituting the gate circuit according to still another embodiment of the invention;

In advance of explaining a gate circuit of the invention, a single logical element, i.e., I²L element used for constructing the gate circuit is first explained.

Figure 1:
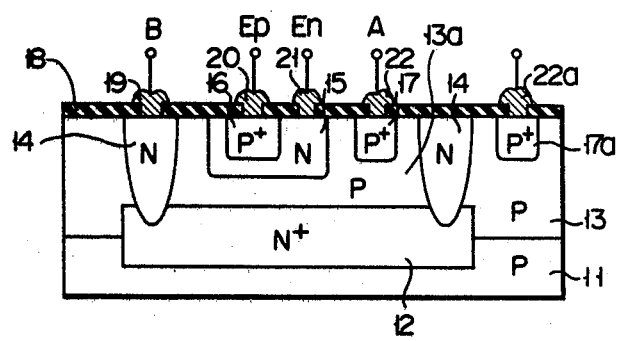
FIG. 1 is a sectional view of a fundamental logical element constituting a gate circuit of the invention.

The single logical element, as shown in FIG. 1, includes a semiconductor substrate 11 of one conductivity type, for example, P conductivity type, a buried region 12 of another conductivity, type or N conductivity type buried in part of the semiconductor substrate, and an epitaxial layer 13 of P conductivity type formed on the semiconductor substrate in a manner including the buried region 12. Note that the P type epitaxial layer 13 and the P type semiconductor substrate 11 are assumed to constitute the P type semiconductor substrate. An N type isolating region 14 extending from the surface of the epitaxial layer 13 to the N type buried region 12 partitions the P type epitaxial layer 13, whereby a P type island on isolated region 13a is formed in the P type epitaxial layer 13. In the P type isolated region 13a an N type first region 15 is formed by diffusion method from the surface of the P type isolated region 13a. In the N type first region 15 a P type second region 16 is formed by diffusion method from the surface of the N type first region. Further, ohmic contact regions 17 and 17a are formed, by diffusion method, in the P type isolated region 13a and epitaxial layer 13 simultaneously with the formation of the P type second region 16, respectively. On the surface of the semiconductor structure is provided an insulation film 18. Through the holes bored in prescribed portions of the insulation film 18 metallic electrode layers, for example, aluminium layers 19, 20, 21, 22 and 22a are formed on the regions 14, 16, 15, 17 and 17a, respectively.

In the above-mentioned structure, a vertical PNP transistor Tr1 is constructed, whose emitter, base and collector are constituted by the P type second region 16, N type first region 15 and P type isolated region 13a, respectively, while a second vertical NPN transistor Tr2 is constructed, whose emitter, base and collector are constituted by the N type first region 15, P type isolated region 13a and N type buried region 12, respectively.

Figure 2:
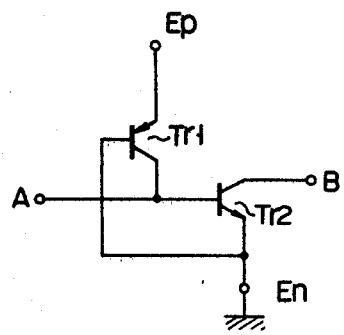
FIG. 2 shows an equivalent circuit of the logical element of FIG. 1.

When, in the logical element having the foregoing structure, the N type first region 15 is grounded through the electrode 21 and in sequence a ground terminal E*n*, the logical element forms a logical circuit shown in FIG. 2. Let's explain the operation of the logical element of FIG. 1 by reference to the logical circuit of FIG. 2. When, under the condition in which an input terminal A is opened or applied with a suitable positive voltage higher than the threshold voltage of the emitter-grounded vertical NPN transistor, a terminal E*p* is applied with a positive voltage of 0.7V, the first vertical PNP transistor Tr1 is rendered operative to permit the positive holes injected from the emitter region 16 into the base region 15 to reach the collector region 13a or the base region of the second vertical NPN transistor Tr2 through the base region 15.

When excessive positive holes are injected in the abovementioned manner into the base region 13a of the second vertical NPN transistor Tr2, electrons are injected from the emitter region 15 to the base region 13a of the second vertical NPN transistor Tr2. That is to say, the emitter-base junction of the second vertical NPN transistor Tr2 is forward biased to render this second vertical transistor Tr2 operative. As a result, the potential of an output terminal B is rendered approximately zero.

In contrast, when the potential of the input terminal A is made zero, the second vertical NPN transistor is brought to a cut-off state to cause the output terminal B to have a positive potential. Namely, this logical element constitutes an inverter wherein when the input has a logical level of "0," the output has a logical level of "1."

Figure 3:
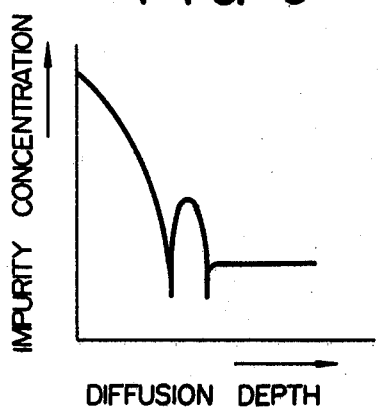
FIGS. 3 and 4 show respective impurity concentration profiles of first and second vertical transistors of the logical element.

According to the above logical element, the base width of the first vertical PNP transistor constituting a current source can be made extremely narrow since adjustable by controlling the diffusion depth. Further, since, as apparent from the impurity concentration profile shown in FIG. 3, an accelerating field is applied to the carriers within the semiconductor region, the carrier injection efficiency and transfer efficiency are improved to a great extent. Further, since the collector region of the first vertical PNP transistor surrounds entirely the emitter region thereof, the rate at which carriers are collected into the collector region is extremely increased. For this reason, the first vertical PNP transistor has a high current amplification factor over a wide range of current values to cause a remarkable reduction in power dissipation of the logical element.

Figure 4:
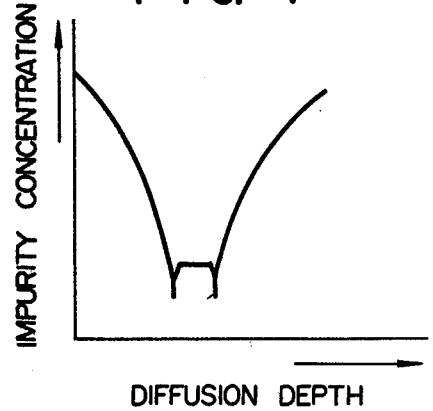

Further, since that second vertical NPN transistor Tr2 of one logical element whose emitter region is constituted by the N type first region 15, the logical element being electrically separated from another logical element on the same substrate, is used as an inverter, that second vertical NPN transistor has a high current amplification factor over a broad range of current values, and also an extremely large gain-bandwidth product $f_T$. Further, the current amplification factor of the second vertical NPN transistor using the buried region 12 and the N type separate region 14 as the emitter can be set to an appropriate value. In this case, as apparent from the impurity concentration profile shown in FIG. 4, the impurity concentration of the collector regions 12, 14 is higher than that of the base region 13a and in addition this base region is constituted by the isolated region 13a whose impurity concentration is constant. Therefore, no decelerating field is applied to carriers, whereby the carrier injection efficiency from the collector region to the base region is strikingly improved. Accordingly, the current amplification factor of the transistor can be optionally determined by setting the impurity concentration of the regions 12, 15 and 13a to an appropriate value and simultaneously controlling the base width to a suitable value. As a result, the "current hogging" problem inherent to a DCTL (Direct Coupled Transistor Logic) can be completely solved to secure the operation as of the logical circuit.

Figure 5:
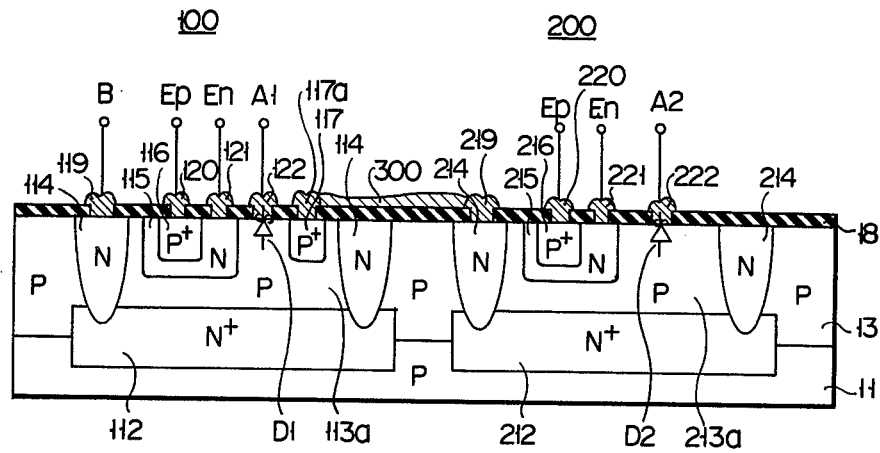
FIG. 5 is a sectional view of a semiconductor device constituting the gate circuit according to an embodiment of the invention.

By combining a plurality of logical elements having the above-mentioned excellent characteristics a highly excellent gate circuit can be constructed. FIG. 5 shows an embodiment of a gate circuit constituted by the use of the above-mentioned logical elements. Note that explanation will be made with the same parts and sections as those of FIG. 1 denoted by the same reference numerals.

As seen from FIG. 5, a plurality of buried regions, in this embodiment two buried regions 112, 212 are formed in the P type semiconductor substrate 11, and the P type epitaxial layer 13 is formed on the P type semiconductor substrate 11 in a manner including therein those two buried regions 112, 212. The epitaxial layer 13 on the buried regions 112, 212 is partitioned by N type separate regions 114, 214 extending from the surface of this epitaxial layer 13 to the buried regions 112, 212, and in this epitaxial layer 13 two P type isolated regions 113a, 213a are formed. In these regions 113a, 213a N type first regions 115, 215 are formed, respectively, and in these regions 115, 215 P$^{30}$ type second regions 116, 216 are formed by diffusion method, respectively. On respective parts of the surfaces of the P type isolated regions 113a, 213a metal layers 122, 222 are formed by deposition method, whereby Schottky diodes D1, D2 are formed at the junction portions between the metal layers 122, 222 and the corresponding P type isolated regions 113a, 213a, respectively. In this embodiment, it is necessary that the Schottky diodes have a forward voltage lower than the threshold voltage of the inverter element. Accordingly, titanium (Ti) is preferable as a Schottky metal. On the surfaces of the regions 114, 116, 115, 214, 216 and 215 electrodes 119, 120, 121, 219, 220 and 221 are provided through the holes bored in the insulation film 18. The electrode 219 of the region 214 is connected, by means of a metallic connection film 300 extending over the insulation film 18, to an electrode 117a provided on the surface of an ohmic contact region 117 for being brought into ohmic contact with the P type isolate region 113a.

In the above-mentioned semiconductor structure, a first logical element 100 is composed of a first vertical PNP transistor whose emitter, base and collector are constituted by the P$^+$ type second region 116, N type first region 115 and P type isolated region 113a, respectively, and a second vertical NPN transistor whose emitter, base and collector are constituted by the N type first region 115, P type isolated region 113a and N$^+$ type buried region 112, respectively. Similarly, a second logical element 200 is composed of a first vertical PNP transistor whose emitter, base and collector are constituted by the P$^+$ type second region 216, N type first region 215, and P type isolated region 213a, respectively, and a second vertical NPN transistor whose emitter, base and collector are constituted by the N type first region 215, P type isolated region 213a and N$^+$ type buried region 212, respectively. The base region 113a of the second vertical NPN transistor of the first logical element 100 is connected to the collector region 214, 212 of the second NPN transistor of the second logical element 200.

Figure 6:
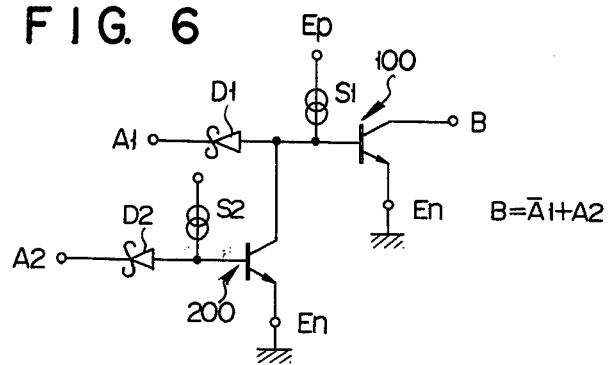
FIG. 6 is a circuit diagram showing the gate circuit constituted by the semiconductor device of FIG. 5.

When equivalently illustrated, the above semiconductor device or gate circuit is as shown in FIG. 6. In this figure, the respective first PNP transistors of the first and second logical elements 100, 200 are shown as constituting current sources S1, S2, respectively.

The operation of this gate circuit is as follows. It will be easily understood from FIG. 6 that between the input signal being supplied to input terminals A1, A2 and the output signal developing at an output terminal B there exists the relation of B=$\overline{A1+A2}$ (Note that for convenience of explanation the same terminals and signals are denoted by the same reference numerals). Namely, when the input signals having logical levels of "1" and "0," respectively, are supplied to the input terminals A1, A2, respectively, the second transistor of the second logical element 200 is rendered non-conductive, whereby the second transistor of the first logical element 100 is rendered conductive. Accordingly, a "0" signal appears at the output terminal B. When a "1" signal is supplied to both of the input terminals A1 and A2, the second transistor of the second logical element 200 is rendered conductive, whereby the second transistor of the first logical element 100 is rendered non-conductive. Accordingly, a "1" signal develops at the output terminal B. When "0" and "1" signals are supplied to the input terminals A1 and A2, respectively, the second transistor of the second logical element 200 is rendered conductive, so that a "1" signal develops at the output terminal B. Where the input signals being supplied are both a "0" signal, the second transistor of the first logical element 100 is rendered non-conductive as a matter of course, whereby the output signal is a "1" signal. To show the above-mentioned logical operation by using a truth value table, the following results.

| A1 | 1 | 1 | 0 | 0 |
|----|---|---|---|---|
| A2 | 0 | 1 | 1 | 0 |
| B  | 0 | 1 | 1 | 1 |

The above gate circuit is constructed by the use of the logical elements each having the N$^+$ type buried layer and constituted by the first and second vertical transistors, that is, by the use of logical elements each designed to have the inverter transistor whose emitter is formed of the N diffusion region 115. But this gate circuit may be constructed by the use of the logical elements (Self-aligned Super Injection Logic: S$^2$L) disclosed in U.S. patent application Ser. No. 644,292, that is, by the use of logical elements each designed to have an inverter transistor whose emitter is formed of a substrate.

Figure 7:
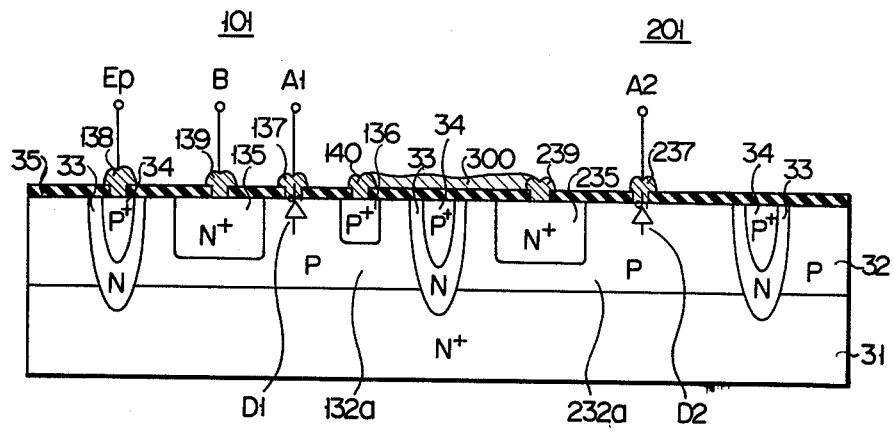
FIG. 7 is a sectional view of another semiconductor device constituting the gate circuit.

A gate circuit constructed by using such S$^2$L elements is shown in FIG. 7.

According to the gate circuit of FIG. 7, a P type epitaxial layer 32 is formed on an N$^+$ type semiconductor substrate 31. This epitaxial layer 32 is partitioned by an N type isolating region 33 formed in, for example, a grid shape, and extending from the surface of the layer 32 to the substrate 31, whereby a plurality of, for example, two P type isolated regions 132a, 232a are formed. In the N type isolating region 33 is formed a P$^+$ type first region 34. In the P type isolated regions 132a, 232a are formed N$^+$ type second regions 135, 235, respectively. In the P type isolated region 132a is formed by diffusion an ohmic contact region 136 for being brought to that region 132a. Metal layers 137, 237 are formed by deposition on respective parts of the surfaces of the P type isolated regions 132a, 232a, respectively, whereby Schottky diodes D1, D2 are formed at the junction portions between the metal layers 137, 237 and the corresponding P type isolated regions 132a, 232a. Ti is preferable as this Schottky metal. Note that electrode metal layers 138, 139, 140 and 239 are formed by deposition on the surfaces of the regions 34, 135, 136, and 235, respectively. On the surface of the above-constructed semiconductor structure an insulation film 35 is formed except for contact portions. Further, the metal layer 140 is connected to a metal layer 239 by means of a metallic connection layer 300 provided on a surface portion of the insulation film 35, whereby the P type isolated region 132a, is connected to the N$^+$ type second region 235.

According to the above semiconductor device of FIG. 7, a first logical element 101 is constituted by a lateral PNP transistor whose emitter, base and collector are constituted by the P$^+$ type first region 34, N type isolating region 33 and P type isolated region 132a, respectively, and a vertical NPN transistor whose emitter, base and collector are constituted by the N$^+$ type semiconductor substrate 31, P type isolated region 132a and N$^+$ type second region 135. On the other hand, a second logical element 201 is constituted by a lateral PNP transistor whose emitter, base and collector are constituted by the P+ type first region 34, N type isolating region 33 and P type isolated region 232a, respectively, and a vertical NPN transistor whose emitter, base and collector are constituted by the N+ type semiconductor substrate 31, P type isolated region 232a and N+ type second region 235 respectively.

According to the above semiconductor device of FIG. 7, the N type isolating region 33 and P+ type first region 34 of the lateral PNP transistor of each logical element are formed with the use of the same mask hole by double diffusion, and the base region (N type isolating region) 33 can be so formed as to have a uniform and very narrow base width, as a whole. At the junction surface between the emitter region 34 and the base region 33 a suitable inclination of impurity concentration is formed to permit application of a positive accelerating field to the carriers injected from the emitter region. Further, the emitter region 34 surrounds the entire periphery of the collector region 132a (232a) with the base region 33 interposed therebetween. As a result, carrier injection and transfer efficiencies are increased. Simultaneously, with regards to the vertical transistor, the impurity concentration ratio between the emitter region 31 and the base region 132a (232a) is set to a suitable value; the density of recombination center within the base region 132a (232a) is decreased; and further the impurity concentration of the emitter region can be made higher than that of the base region, so that this vertical transistor has high current amplification factor and excellent high frequency characterstics. Accordingly, the logical element composed of the above-mentioned lateral transistor and vertical transistor apparently has extremely excellent characteristics.

Note that since the above semiconductor device of FIG. 7 has the same circuit construction as that of FIG. 6, the operation thereof is omitted.

Figure 8:
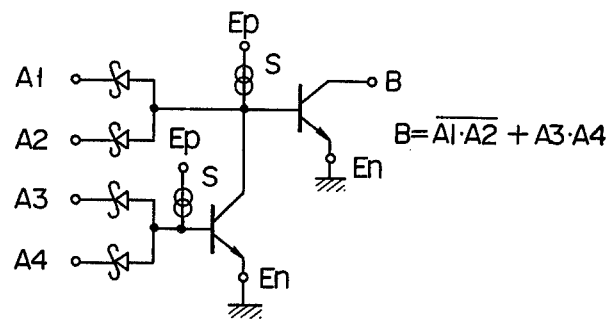
FIG. 8 is a circuit diagram of a multi-input type gate circuit.
Figure 9:
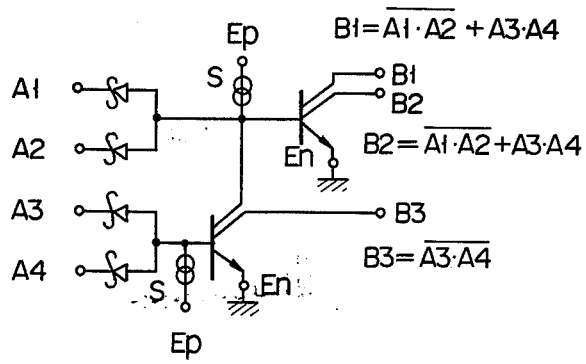
FIG. 9 is a circuit diagram of a multi-input and-output type gate circuit.

In the respective embodiments shown in FIGS. 5 and 7, if a plurality of Schottky diodes are formed at the P type isolated region, a multi-input type gate circuit shown in, for example, FIG. 8 will be obtained. When it is now assumed that, in the gate circuit of FIG. 8, A1, A2, A3 and A4 represent input signals, respectively, (for convenience the terminals and their corresponding signals are represented by the same marks, respectively), a signal satisfying the logical formula of $B = \overline{A1 \cdot A2 + A3 \cdot A4}$ develops at an output terminal B. Further, if, in FIG. 7, one or more N type regions are additionally formed in the P type isolated region, a multi-input and output type gate circuit such as that shown in FIG. 9 will be obtained. Assume now that in the gate circuit of FIG. 9 A1, A2, A3 and A4 represent input signals. Then, a signal satisfying the logical formula of $B1 = B2 = \overline{A1 \cdot A2 + A3 \cdot A4}$, $B3 = \overline{A3 \cdot A4}$ appears at output terminals B1, B2, and B3, respectively.

In the above-mentioned semiconductor device constituting a gate circuit, the output inversion speed of the logical element thereof, i.e., the speed for permitting inversion of the output from "0" level to "1" level is greatly influenced by an excessive amount of minority carriers accumulated both in the base and collector regions of the vertical NPN transistor. Namely, when the output has a logical level of "0", the vertical NPN transistor is brought to a completely on-state, whereby the emitter-base junction and base-collector junction are forwardly biased to cause an accumulation of excessive minority carriers in the base and collector regions.

Figure 10:
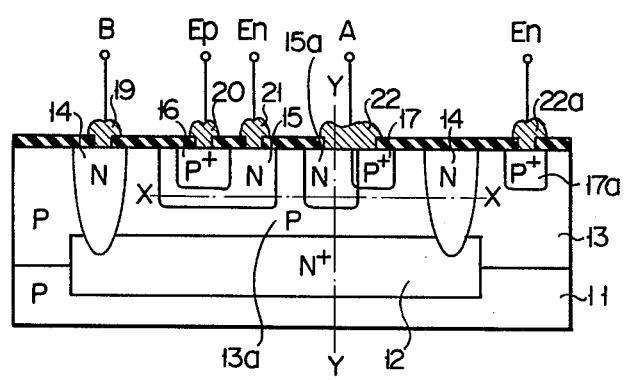
FIG. 10 is a sectional view of a single logical element having a carrier-drafting region.

Even if, in this condition, for the purpose of causing the output level to become "1," a "0" level signal is supplied to the input terminal, the minority carriers accumulated in the base and collector regions of the vertical NPN transistor will flow through these regions, so that the output will not soon have a "1" level. For this reason, according to the invention, in order to suppress the excessive accumulation of minority carriers in the transistor operating as an inverter element to increase the inversion speed from "0" to "1" level, i.e., the switching speed of that transistor, an N type third region 15a is formed by diffusion, as shown in FIG. 10, in the P type isolated region 13a so as to be partially overlapped on the P+ type ohmic contact region 17, and that N type third region 15a and this region 17 are mutually connected by means of a metal layer 22 deposited on their respective surface portions. Namely, the N type third region 15a is connected to the P type isolated region 13a through the ohmic contact region 17. Note that since the logical element shown in FIG. 10 has the same construction and operation as those of the logical element of FIG. 1 except for the N type third region 15a, the same parts and sections are denoted by the same reference numerals and description thereof is omitted.

When equivalently illustrated, the logical element provided with the N type third region 15a constitutes a logical circuit shown in FIG. 11. As understood from FIG. 11, the above-mentioned N type third region 15a constitutes an additional emitter connected to the base of the vertical NPN transistor to act as a carrier drafting region for drafting carriers as later described.

FIGS. 12A and 12B show, respectively, the carrier distributions in the semiconductor regions with respect to the directions X—X and Y—Y of the logical element shown in FIG. 10, provided with the N type third region, i.e., carrier drafting region 15a. In FIG. 12A, in the emitter region 15 of the second vertical NPN transistor Tr2 there exist the minority carriers or positive holes (indicated by marks +) injected from the emitter region 16 of the first vertical PNP transistor Tr1 and the base region 13a of the second vertical NPN transistor Tr2, while in the base region 13a of the second vertical NPN transistor there exist the minority carriers or electrons (indicated by marks −) injected from the collector region 12 and the emitter region 15 thereof. There exists no carrier in the N type third region or carrier drafting region 15a connected to the base region 13a. The carrier distribution shown by broken lines in FIG. 12A is one in the case where no carrier drafting region 15a is provided. Further, in FIG. 12B, in the base region 13a there exist the minority carriers or electrons injected from the emitter region 15 and collector region 12. There exists no minority carrier in the carrier drafting region 15a connected to the base region 13a. In the collector region 12, however, there exist the minority carriers or positive holes injected from the base region 13a. Note that the broken lines of FIG. 12B show the carrier distributions in the case where no carrier drafting region 15a is provided, as in the case of FIG. 12A. In this way, excessive accumulation of the minority carrier in the logical element is suppressed or prevented by provision of the carrier drafting region 15a to cause a prominent improve in the speed for permitting the output of the logical element to be inverted from "0" level to "1" level. It should be noted that the carrier drafting region 15a may be formed so as to occupy as large an area as possible in the base region 13a.

Figure 16:
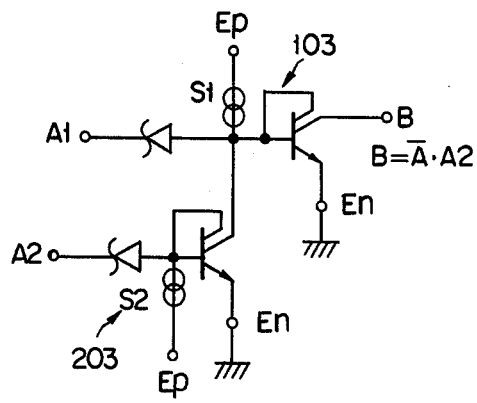
FIG. 16 is a circuit diagram showing the gate circuit constituted by the semiconductor device of FIG. 15.

An embodiment of the invention wherein a plurality of logical elements each having the above-mentioned carrier drafting region are formed on the same substrate to construct a desired gate circuit is illustrated in FIG. 13. This embodiment, except for the carrier drafting regions 115a and 215a, is the same as that of FIG. 5 in respect of its construction and operation, and the same parts and sections are denoted by the same reference numerals. The carrier drafting region 115a and ohmic contact region 117 of a first logical element 102 are connected to each other by means of a metal layer 122a. The metal layer 122a is connected to a metal layer 219 formed on the N type isolating region 214 of a second logical element 202, or the collector region 214 thereof through the metallic film 300. That is to say, the isolated region 113a of the logical element 102 is connected to be isolating region 214 of the logical element 202. Further, the carrier drafting region 215a of the second logical element 202 is connected to an ohmic contact region 217 by means of a metal film 222a. The semiconductor device of FIG. 13 constitutes a gate circuit shown in FIG. 14. Similarly, an embodiment of the invention obtained by providing a carrier drafting region for the embodiment of FIG. 7 is illustrated in FIG. 15. In the case of this embodiment, carrier drafting regions 135a, 235a constitute additional collector regions of the respective vertical NPN transistors of first and second logical elements 103, 203, respectively. As apparent from FIG. 15, the carrier drafting region 135a of the first logical elemnt 103 is connected to the P+ type ohmic contact region 136 by means of the metal layer 140 and is connected also to the collector region 235 of the vertical NPN transistor of the second logical element 203 by means of the metallic film 300. Further, the carrier drafting region 235a of this second logical element 203 is connected to a P+ type ohmic contact region 236 by means of a metal layer 240. It is to be noted that in the embodiment of FIG. 15 the same parts and sections as those of FIG. 7 are denoted by the same reference numerals. When equivalently illustrated, the semiconductor device of FIG. 15 constitutes a gate circuit shown in FIG. 16.

The above-metnioned gate circuit shown in FIGS. 13 to 16 not only includes the advantages of the gate circuit shown in FIGS. 5 to 7 but can also operate at an operating speed higher than that of the gate circuit shown in FIGS. 5 to 7.

Note that if, in the respective embodiments of FIGS. 13 and 15, a plurality of Schottky diodes are formed at the input regions; namely regions 113a, 213a, 132a and 232a, respectively, a multi-input type gate circuit will be obtained, and further that if, in the embodiment of FIG. 15, a plurality of N+ type second regions are formed at the regions 132a, 232a, a multi-input and output type gate circuit will be readily obtained.

Figure 17:
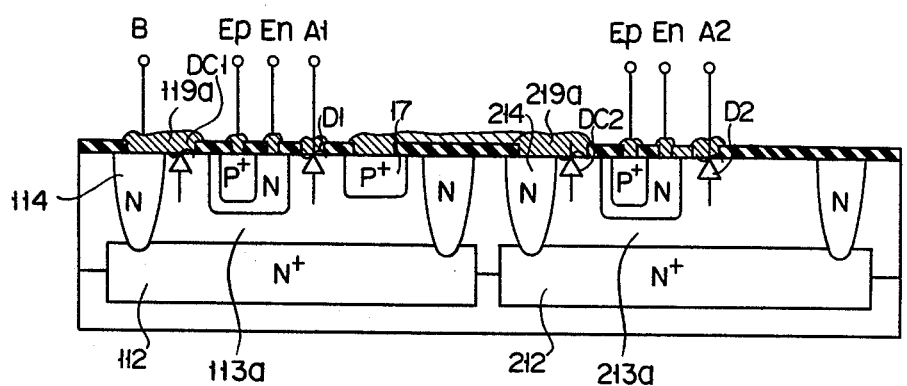
FIG. 17 is a sectional view of a semiconductor device constituting the gate circuit according to a further embodiment of the invention and involving therein a clamping diode.
Figure 18:
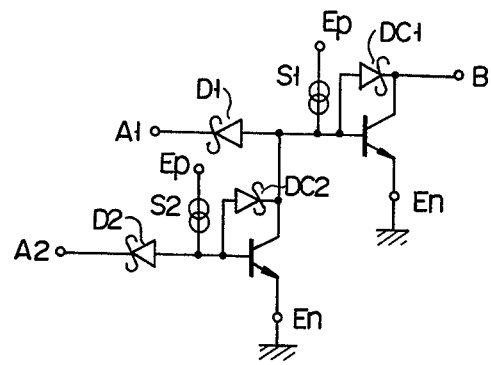
FIG. 18 is a circuit diagram showing the gate circuit constituted by the semiconductor device of FIG. 17.
Figure 19:
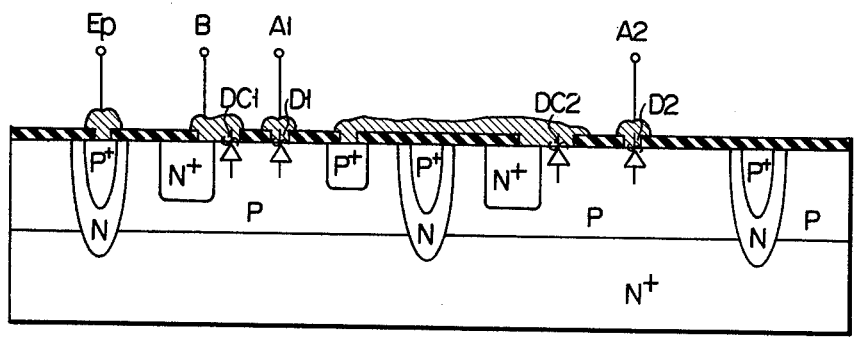
FIG. 19 is a sectional view of a semiconductor device constituting the gate circuit according to a still further embodiment of the invention and involving a clamping diode.

Further, if, in the embodiment shown in FIG. 5, a Schottky diode DC1 (DC2) as a clamping diode is provided, as shown in FIG. 17, between the base region 113a (213a) and collector region consisting of 114 and 112 (214 and 212), the operating speed of the resulting gate circuit will be improved further. This clamping diode DC1 (DC2) is formed at the junction portion between a metal layer 119a (219a) formed over a region including two surface portions—a surface portion of the N type isolating region 114(214) and a surface portion of the P type isolated region 113a (213a) approximating that isolating region 114, and the P type isolated region 113a (213a), and is connected, by means of the metal layer 119a (219a), between the base region 113a (213a) of the second vertical NPN transistor and the collector region thereof consisting of 114 and 112 (214, 212). FIG. 18 shows a circuit corresponding to the semiconductor device of FIG. 17. In this circuit, however, the logic voltage swing level is determined substantially by the difference between the forward voltage of the clamping diode DC1 and that of the Schottky diode D1 and therefore it is important to design properly the Schottky metal and the junction area. For example, where Ti is used as the Schottky metal, the junction area of the clamping diode DC1 is so designed as to be made smaller than that of the Schottky diode D1. The above-mentioned clamping diode, as shown in FIG. 19, is apparently applicable also to the embodiment of FIG. 7. In the preceding embodiments, the PNP transistor is used as the current source, but this current source may be constructed by a current source circuit including a resistor. Further, in the preceding embodiment, the emitter of the transistor as the inverter element is grounded, but may be connected to a desired point of potential.

In the preceding embodiments, the conductivity type of various regions is determined by the use of the P type semi-conductor substrate, but may be determined by using the N type semiconductor substrate in accoradance with the conductivity type thereof.

What we claim is:

1. A gate circuit having a plurality of logic elements formed on a single semiconductor substrate, each of said plurality of logic elements comprising at least one Schottky diode having a cathode and an anode, the cathode operating as an input to the logic element; a transistor having a base connected to an anode of said at least one Schottky diode, at least one collector, at least one emitter, and operating as an inverter; and a current source circuit element connected to said base of said transistor and said anode of said at least one Schottky diode, one of said plurality of logic elements being the output of said gate circuit at the said at least one collector of its transistor, the base of its transistor being connected to the said at least one collector of the transistor of another one of said plurality of logic elements, the emitters of the transistors of said plurality of logic elements being connected directly to a common potential point.

2. A gate circuit having a plurality of logic elements formed on a single semiconductor substrate, each of said plurality of logic elements comprising at least one Schottky diode having a cathode and an anode, the cathode operating as an input to the logic element; a first transistor having a base connected to the anode of said at least one Schottky diode, at least one collector, at least one emitter, and operating as an inverter; and a current source circuit element connected to said base of said first transistor and said anode of said at least one Schottky diode and comprising a second transistor of opposite conductivity type to said first transistor, the collector of said second transistor and the base of said first transistor comprising a first common region on the substrate, and the base of said second transistor and said at least one emitter of said first transistor comprising a second common region on the substrate, the said at least one collector of the first transistor of one of said plurality of logic elements operating as the output of said gate circuit, and the said at least one collector of the first transistor of another one of said plurality of logic elements being connected to the base of the first transistor whose said at least one collector operates as the output of the gate circuit, and the emitters of the first transistors of said plurality of logic elements being connected directly to a common potential point.

3. A gate circuit according to claim 2, wherein each of said logic elements includes a plurality of said Schottky diodes connected to the base of the first transistor.

4. A gate circuit according to claim 2, wherein said first transistor of said logic element whose collector operates as the output of the gate circuit has a plurality of collectors.

5. A gate circuit according to claim 2, wherein said first transistor of said logic element whose collector operates as the output of the gate circuit has an additional emitter connected to its base.

6. A gate circuit according to claim 2, wherein said first transistor of said logic element whose collector operates as the output of the gate circuit has an additional collector connected to its base.

7. A gate circuit according to claim 5, wherein said first transistor of said logic element whose collector operates as the output of the gate circuit has a plurality of said Schottky diodes connected to its base.

8. A gate circuit according to claim 6, wherein said first transistor of said logic element whose collector operates as the output of the gate circuit has a plurality of said Schottky diodes connected to its base.

9. A gate circuit according to claim 2, wherein the logic elements include a Schottky diode having a cathode connected to the collector of its first transistor and an anode connected to the base of its first transistor.

10. A gate circuit according to claim 9, wherein each of said logic elements has a plurality of said Schottky diodes connected to the base of its respective first transistor.

* * * * *